United States Patent
Yeh et al.

(10) Patent No.: US 6,642,137 B2
(45) Date of Patent: Nov. 4, 2003

(54) METHOD FOR MANUFACTURING A PACKAGE STRUCTURE OF INTEGRATED CIRCUITS

(75) Inventors: Nai Hua Yeh, Hsinchu Hsien (TW); Chen Pin Peng, Hsinchu Hsien (TW); Jichen Wu, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/147,029

(22) Filed: May 15, 2002

(65) Prior Publication Data

US 2002/0130391 A1 Sep. 19, 2002

Related U.S. Application Data

(62) Division of application No. 09/770,054, filed on Jan. 24, 2001.

(51) Int. Cl.⁷ .............................................. H01L 21/44
(52) U.S. Cl. ........................................ 438/613; 438/460
(58) Field of Search .............................. 438/106, 110, 438/113, 460, 462, 612, 613, 461, 463, 464, 948

(56) References Cited

U.S. PATENT DOCUMENTS

| | | | |
|---|---|---|---|
| 5,736,453 A | * | 4/1998 | Kadonishi |
| 5,742,100 A | * | 4/1998 | Schroeder et al. |
| 6,198,165 B1 | * | 3/2001 | Yamaji et al. |
| 6,207,473 B1 | * | 3/2001 | Hirai et al. |
| 6,307,479 B1 | * | 10/2001 | Wang |

* cited by examiner

Primary Examiner—Phuc T. Dang
(74) Attorney, Agent, or Firm—Pro-Techtor International Services

(57) ABSTRACT

A package structure for an integrated circuit includes a substrate, an integrated circuit, an adhesive layer, a plurality of wirings, and a glue layer. The substrate has a first surface and a second surface. The first surface is formed with a plurality of signal input terminals. The second surface is formed with a plurality of signal output terminals for electrically connecting to the circuit board. The integrated circuit has a lower surface and an upper surface. Recesses are formed at two sides of the lower surface, and a plurality of bonding pads are formed on the upper surface. The adhesive layer is used for adhering the lower surface of the integrated circuit to the first surface of the substrate. The wirings are electrically connecting to the bonding pads of the integrated circuit and to the signal input terminals of the substrate. The glue layer is used for sealing the plurality of wirings and the integrated circuits. According to the structure, the problem caused by the overflowed glue in the integrated circuit can be effectively avoided. A method for manufacturing the structure is also disclosed.

5 Claims, 2 Drawing Sheets

US 6,642,137 B2

METHOD FOR MANUFACTURING A PACKAGE STRUCTURE OF INTEGRATED CIRCUITS

CROSS-REFERENCES TO RELATED APPLICATION

The present invention is a divisional application of the co-pending U.S. Ser. No. 09/770,054, filed on Jan. 24, 2001.

BACKGROUND OF THE INVENTION

1. Field of the Invention

The invention relates to a package structure and method for integrated circuits, and in particular, to a package structure in which integrated circuits can be easily adhered to the substrate in order to solve the problem caused by the overflowed glue, thereby implementing a chip scale package.

2. Description of the Related Art

In the current technological field, every product needs to be light, thin, and small. Therefore, it is preferable that the integrated circuit has a small volume in order to meet the demands of the products. The technology of a chip scale package can reduce the volume of an integrated circuit after packaging, thereby making the product small, thin, and light.

Referring to FIG. 1, in the technology of a conventional package or a chip scale package, when the integrated circuit 10 is adhered onto the substrate 12, the glue often overflows into the substrate 12 from the adhering surface of the integrated circuit 10 due to the improper control of the adhesive layer 14. Thus, the overflowed glue 16 may cover the signal input terminals 18 of the substrate 12 and influence the wire bonding processes in which a plurality of wirings 20 are formed. As a result, in order to prevent the signal input terminals 18 of the substrate 12 from being covered by the overflowed glue 16, the substrate 12 has to be enlarged. By doing so, the signal input terminals 18 are far away from the integrated circuit 10. In this case, the signal input terminals 18 of the substrate 12 are free from being covered by the overflowed glue 16. Therefore, the problem caused by the overflowed glue can be solved.

However, the overall volume of the package of the integrated circuit enlarges as the size of the substrate 12 increases. Thus, a chip scale package cannot be implemented, and the product cannot be made small, thin, and light.

To solve this problem caused by the overflowed glue, there is provided a package structure in which integrated circuits can be easily adhered to the substrate, thereby implementing a chip scale package.

SUMMARY OF THE INVENTION

It is therefore an object of the invention to provide a package structure and method for the integrated circuit for solving the problem caused by the overflowed glue and for facilitating the manufacturing processes.

It is therefore another object of the invention to provide a package structure and method for the integrated circuit capable of scaling down the package structure to make the products small, thin, and light.

According to one aspect of the invention, a package structure for an integrated circuit includes a substrate, an integrated circuit, an adhesive layer, a plurality of wirings, and a glue layer. The substrate has a first surface and a second surface. The first surface is formed with a plurality of signal input terminals. The second surface is formed with a plurality of signal output terminals for electrically connecting to the circuit board. The integrated circuit has a lower surface and an upper surface. Recesses are formed at two sides of the lower surface, and a plurality of bonding pads are formed on the upper surface. The adhesive layer is used for adhering the lower surface of the integrated circuit to the first surface of the substrate. The wirings are electrically connected to the bonding pads of the integrated circuit and to the signal input terminals of the substrate. The glue layer is used for sealing the plurality of wirings and the integrated circuits.

According to another aspect of the invention, a method for manufacturing a package structure of integrated circuits includes the steps of: providing a substrate; providing a wafer formed with a plurality of integrated circuits, a plurality of scribing lines being formed between adjacent integrated circuits; scribing the wafer along each of the scribing lines to predetermined depths using a scribing tool having a larger width so as to form recesses at two sides of each of the integrated circuits; cutting the wafer along each of the scribing lines using a scribing tool having a smaller width to separate each of the integrated circuits; coating an adhesive layer to adhere the integrated circuit onto the substrate; electrically connecting the plurality of wirings to the integrated circuit and to the substrate; and providing a glue layer for sealing the plurality of wirings and the integrated circuit.

According to the structure and method of the invention, the problem caused by the overflowed glue in the integrated circuit can be effectively avoided.

DETAIL DESCRIPTION OF THE INVENTION

The embodiments of the invention will now be described with reference to the drawings.

Figure 1:
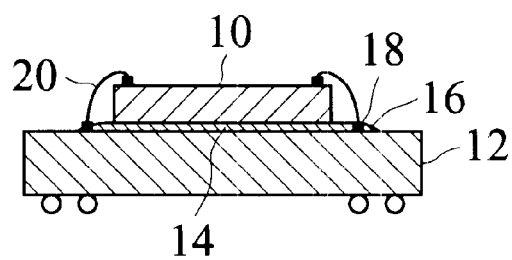
FIG. 1 is a schematically cross-sectional view showing a conventional package structure of an integrated circuit.
Figure 2:
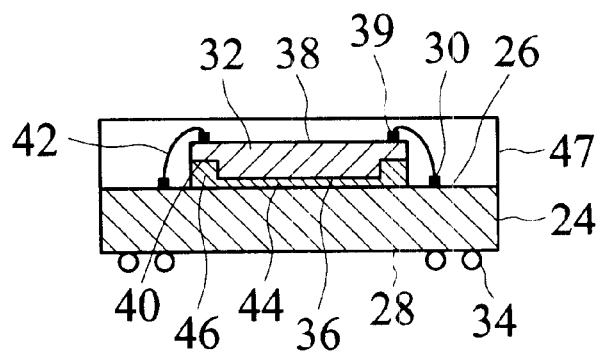
FIG. 2 is a cross-sectional view showing a package structure of an integrated circuit in accordance with one embodiment of the invention.

Referring to FIG. 2, the package structure of the integrated circuit of the invention includes a substrate 24, an integrated circuit 32, a plurality of wirings 42, and an adhesive layer 44.

The substrate 24 has a first surface 26 and a second surface 28 opposite to the first surface 26. The first surface 26 is formed with a plurality of signal input terminals 30 for transmitting the signals from the integrated circuit 32 to the substrate 24. The second surface 28 of the substrate 24 is formed with a plurality of signal output terminals 34 for transmitting the signals from the integrated circuit 32 to the circuit board (not shown). The signal output terminals 34 can be metallic balls arranged in the form of a ball grid array (BGA).

The integrated circuit 32 has a lower surface 36 and an upper surface 38 opposite to the lower surface 36. Two vertical recesses 40 are formed on two sides of the lower surface 36 of the integrated circuit 32. The lower surface 36 is adhered onto the first surface 26 of the substrate 24. The upper surface 38 is formed with a plurality of bonding pads 39 for electrically connecting to the substrate 24.

Each of the wirings 42 has a first end and a second end away from the first end. The first ends of the wirings 42 are electrically connected to the bonding pads 39 of the integrated circuit 32, respectively. The second ends of the wirings 42 are electrically connected to the signal input terminals 30 of the substrate 24, respectively. Thus, the signals from the integrated circuit 32 can be transmitted to the substrate 24. The plurality of wirings 42 may be connected to the bonding pads 39 of the integrated circuit 32 by way of wedge bonding. The first ends of the plurality of wirings 42 are located on the periphery of the upper surface 38 of the integrated circuit 32. In addition, the plurality of wirings 42 may be electrically connected to the bonding pads 39 of the integrated circuit 32 by way of ball bonding.

The adhesive layer 44 is coated in between the integrated circuit 32 and the substrate 24 for adhering the integrated circuit 32 to the substrate 24. Since the quantity of the glue forming the adhesive layer 44 cannot be easily controlled, the glue forming the adhesive layer 44 often overflows from the lower surface 36 of the integrated circuit 32. Thus, according to the structure of the invention, the overflowed glue 46 overflowed from the adhesive layer 44 fills the recesses 40 of the integrated circuit 32. In this case, the signal input terminals 30 of the substrate 24 are free from being covered.

Figure 3:
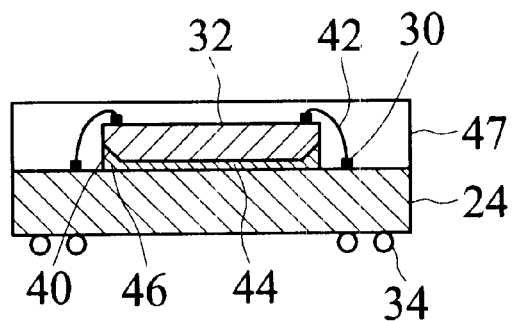
FIG. 3 is a schematic view showing a package structure of an integrated circuit in accordance with another embodiment of the invention.

Referring to FIG. 3, the recesses 40 of the integrated circuit 32 may be made to be of the shapes of slant planes. In this case, when the quantity of the overflowed glue can be controlled to be small, the overflowed glue can be totally filled into the recesses 40. Thus, relatively large gaps will never exist in the recesses 40.

A glue layer 47 is used for sealing the integrated circuit 32 and the plurality of wirings 42 for protecting the integrated circuit 32 and the wirings 42.

Figure 4:
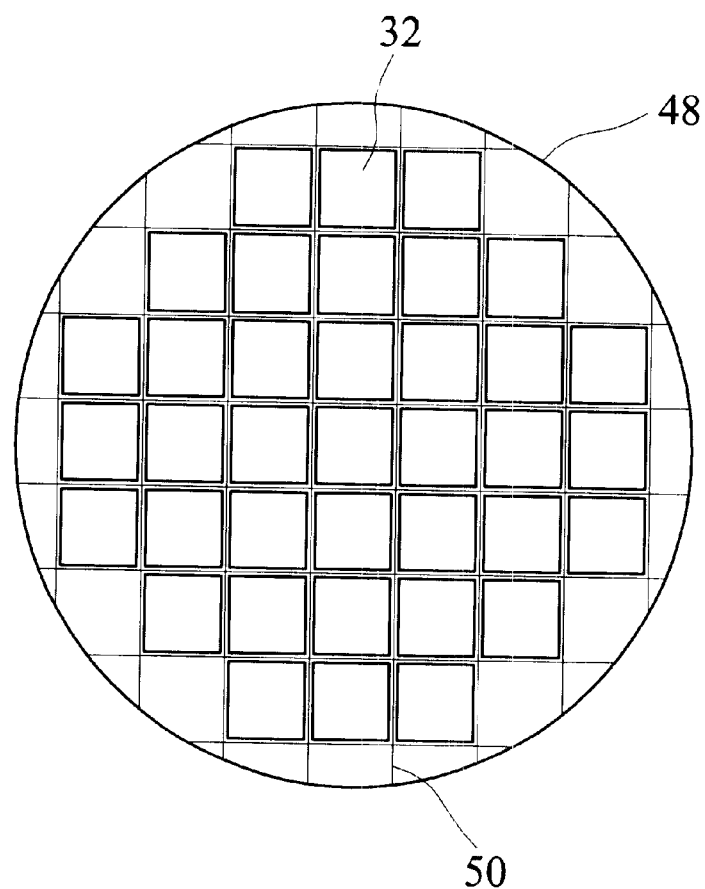
FIG. 4 is a top view showing a wafer of the invention.

Referring to FIG. 4, a wafer 48 includes a plurality of integrated circuits 32. A plurality of scribing lines 50 are formed in between two adjacent integrated circuits 32.

Figure 5:
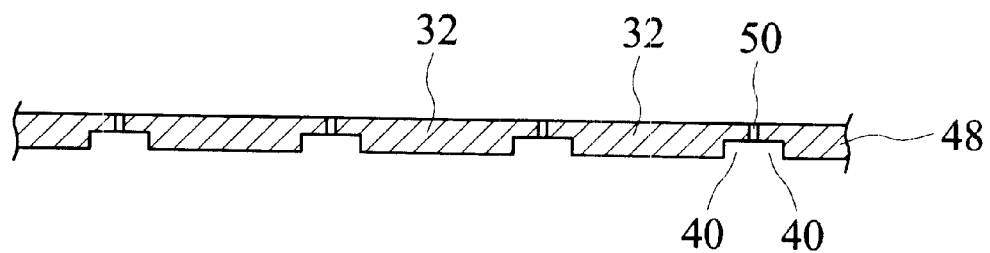
FIG. 5 is a schematic illustration showing the scribing of the integrated circuit of the invention.

Referring to FIG. 5, the processes for manufacturing the recesses 40 of the integrated circuits 32 will be described in detail. First, recesses 40 not penetrating through the wafer 48 are formed by scribing the scribing lines 50 using a scribing tool having a large width. Next, the wafer 48 is scribed at the scribing lines 50 using another scribing tool having a small width. Therefore, each of the integrated circuits 32 on the wafer 48 can be separated and recesses 40 can be formed in each of the integrated circuits 32.

According to the above-mentioned structure, the package structure of the integrated circuit of the invention has the following advantages.

1. The recesses 40 of the integrated circuit 32 can be easily manufactured, so the manufacturing costs of the integrated circuit 32 will not be greatly increased.

2. Since the integrated circuit 32 with recesses 40 are used for packaging, the overflowed glue will not cause any problem. Thus, the package structure can be easily manufactured, the manufacturing costs can be lowered, and the yield can be improved.

3. Since the problem caused by the overflowed glue can be solved, the size of the substrate 24 can be the same as that of the chip. Thus, a chip scale package can be implemented so as to make the products small, thin, and light.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A method for manufacturing a package structure of integrated circuits, comprising the steps of:

providing a substrate;

providing a wafer formed with a plurality of integrated circuits, a plurality of scribing lines being formed between adjacent integrated circuits;

scribing the wafer along each of the scribing lines to predetermined depths using a scribing tool having a larger width so as to form recesses at two sides of each of the integrated circuits;

cutting the wafer along each of the scribing lines using a scribing tool having a smaller width to separate each of the integrated circuits;

coating an adhesive layer to adhere the integrated circuit onto the substrate;

electrically connecting the plurality of wirings to the integrated circuit and to the substrate; and providing a glue layer for sealing the plurality of wirings and the integrated circuit.

2. The method for manufacturing the package structure of the integrated circuit according to claim 1, wherein the substrate includes metallic balls arranged in the form of a ball grid array (BGA).

3. The method for manufacturing the package structure of the integrated circuit according to claim 1, wherein the overflowed glue from the adhesive layer fills the recesses of the lower surface of the integrated circuit when the integrated circuit is adhered to the substrate.

4. The method for manufacturing the package structure of the integrated circuit according to claim 1, wherein the recesses are perpendicular to the lower surface of the integrated circuit.

5. The method for manufacturing the package structure of the integrated circuit according to claim 1, wherein the recesses of the lower surface of the integrated circuit are slant.

* * * * *